(12) United States Patent
Miyamoto

(10) Patent No.: US 6,801,032 B2
(45) Date of Patent: Oct. 5, 2004

(54) TRANSPORT DEVICE FOR TRANSPORTING PARTS TO A TRANSPORT MEDIUM

(75) Inventor: Masayuki Miyamoto, Kyoto (JP)

(73) Assignee: Murata Manufacturing Co., Ltd., Nagaokakyo (JP)

(*) Notice: Subject to any disclaimer, the term of this patent is extended or adjusted under 35 U.S.C. 154(b) by 157 days.

(21) Appl. No.: 09/899,222

(22) Filed: Jul. 6, 2001

(65) Prior Publication Data

US 2002/0023506 A1 Feb. 28, 2002

(30) Foreign Application Priority Data

Jul. 11, 2000 (JP) ........................................ 2000-209513

(51) Int. Cl.[7] .............................................. G01R 31/00
(52) U.S. Cl. ................................................... 324/158.1
(58) Field of Search ............................. 324/158.1, 73.1, 324/765, 757–758; 209/573, 574; 414/227, 273

(56) References Cited

U.S. PATENT DOCUMENTS

| 4,978,913 | A | * | 12/1990 | Hamuro et al. ............. 324/757 |
| 5,034,749 | A | * | 7/1991 | Jungblut et al. ............ 324/758 |
| 5,131,206 | A | * | 7/1992 | Sillner ............................. 53/54 |
| 5,542,579 | A | | 8/1996 | Robbins, III |
| 5,568,870 | A | * | 10/1996 | Utech ......................... 209/573 |
| 6,163,000 | A | * | 12/2000 | Huang ......................... 209/574 |
| 6,220,481 | B1 | | 4/2001 | Miyamoto |

FOREIGN PATENT DOCUMENTS

| JP | 63-127600 | 5/1988 |
| JP | 2-195272 | 9/1990 |
| JP | 8-222890 | 8/1996 |
| JP | 11-208871 | 8/1999 |
| JP | 11-292252 | 10/1999 |

* cited by examiner

Primary Examiner—Vinh P. Nguyen
(74) Attorney, Agent, or Firm—Burns, Doane, Swecker & Mathis, L.L.P.

(57) ABSTRACT

An electronic part transport device includes a transport medium having a plurality of lines of cavities. The lines are concentric with respect to the rotation axis. A driving device rotationally drives the transport medium. A supply device separately supplies a plurality of randomly introduced electronic parts one by one. A delivery device feeds the electronic parts separately supplied by the supply device into the cavities of the transport medium. A removal device takes the electronic parts out of the cavities of the transport medium.

20 Claims, 13 Drawing Sheets

TRANSPORT DEVICE FOR TRANSPORTING PARTS TO A TRANSPORT MEDIUM

BACKGROUND OF THE INVENTION

1. Field of the Invention

The present invention relates to a transport device for separately transporting, one by one, small electronic parts, such as chip-type capacitors and to an inspection apparatus using the transport device.

2. Description of the Related Art

In recent years, there is an increase in the number of requests for characteristic-discriminating apparatuses for electronic parts. The characteristic-discriminating apparatus is needed to inspect various characteristics by a single apparatus. In order to meet such a request, Japanese Unexamined Patent Application Publication No. 2-195272 proposes a characteristic measuring apparatus which includes a movable table with a plurality of retaining holes for passing and holding electronic parts so that both ends of the electronic parts protrude therefrom. A plurality of fixed terminals are arranged in a plane corresponding to the retaining holes of the movable table. A plurality of movable terminals are placed opposed to the fixed terminals with the movable table therebetween.

Characteristic-discriminating apparatuses are also requested to improve throughput. For some recently improved electronic parts such as chip-type capacitors, however, the capacitance has been increased, and the measuring time (time for measuring insulation resistance) tends to be longer than prior capacitors. When characteristic discrimination is performed for these electronic parts, which need a long measuring time, if only one line of retaining holes is formed in the movable table, as described above, the number of electronic parts that can be processed in a certain time is limited, and an improvement of throughput cannot be expected.

As a means for improving throughput, Japanese Unexamined Patent Application Publication No. 11-292252 proposes an apparatus in which a rotary disk has a plurality of concentric lines of cavities. After electronic parts are introduced into the cavities, they are conveyed to a transfer section and are then transferred to a holding plate or the like. By applying this rotary disk having a plurality of cavities to a characteristic-discriminating apparatus, throughput can be improved.

In order to further improve throughput, however, it is important to know how many working areas can be provided between the area where the electronic parts are introduced into the rotary disk until the area where they are removed. That is, it is important to know to what extent an area excluding the functional blocks, can be enlarged. The functional blocks are defined as essential for the characteristic-discriminating apparatus, such as the electronic part supply and removal sections. In the transfer apparatus described in Japanese Unexamined Patent Application Publication No. 11-292252, a large accommodating section having a comb-shaped guide is disposed in an electronic part delivery section. The electronic parts are introduced into the accommodating section at random, are aligned by the comb-shaped guide and are supplied to the cavities of the rotary disk. Therefore, the receiving section occupies a large space equivalent to about 25% of the entire rotary disk. This limits the working area necessary for characteristic discrimination.

SUMMARY OF THE INVENTION

Accordingly, it is an object of the present invention to provide a high-throughput electronic part transport device in which the space of a receiving section is reduced so that a working area is enlarged, and an inspection apparatus using the transport device.

In order to achieve the above object, according to an aspect of the present invention, there is provided an electronic part transport device including a) a transport medium having a plurality of lines of cavities, the lines being concentric with respect to a rotation axis, b) a driving means for rotationally driving the transport medium, c) a supply means for separating and supplying a plurality of randomly introduced electronic parts one by one, d) a delivery means for feeding the electronic parts separately supplied by the supply means into the cavities of the transport medium, and e) a removal means for removing the electronic parts from the cavities of the transport medium.

When electronic parts are introduced into the supply means at random, they are separated one by one and transported by the supply means, and are fed into the cavities of the transport medium by the delivery means. In order to improve throughput, the transport medium is provided with a plurality of cavities which are arranged in lines concentric with respect to the rotation axis. By conveying a plurality of electronic parts held in the cavities, the transport efficiency can be multiplied by the number of cavity lines. When the electronic parts are conveyed to a predetermined position by the transport medium, they are taken out of the cavities by the removal means.

Since the electronic parts are thus separated one by one before being inserted into the cavities of the transport medium, it is only necessary for the delivery means to simply insert the electronic parts into the cavities. For this reason, delivery errors are prevented, the receiving section does not occupy a large space, and a working area can be provided on the transport medium.

Preferably, the supply means includes a) a parts feeder having the same number of aligning paths as the number of cavity lines of the transport medium so as to successively supply the randomly introduced electronic parts while aligning the electronic parts in the aligning paths, and b) a separating means disposed at the distal end of each of the aligning paths so as to separate one by one the electronic parts successively conveyed by the parts feeder.

The parts feeder is formed of, for example, a combination of a bowl feeder and a linear feeder. The same number of parts feeders as the number of the cavity lines of the transport medium may be arranged. The separating means may be disposed at the distal end of each of the parts feeders. Alternatively, the same number of linear feeders (aligning paths) as the number of cavity lines of the transport medium may be connected to a single bowl feeder. The separating means may be disposed at the distal end of each of the linear feeders. By providing a stopping means for temporarily stopping the movement of the second part of the parts conveyed in an aligned state, only the leading part can be easily separated.

Preferably, the supply means includes a) a parts feeder for successively supplying a plurality of electronic parts introduced at random while aligning the electronic parts, b) a distributing rotor for distributing the electronic parts aligned and supplied by the parts feeder into a plurality of recesses formed on the outer periphery thereof, and c) a driving means for rotationally driving the distributing rotor in one direction.

In this case, the electronic parts aligned by the parts feeder are individually held in the recesses of the distributing rotor, and are thereby separated one by one. By simultaneously feeding the same number of electronic components, of the electronic parts held in the recesses of the distributing rotor, as the number of cavity lines of the transport medium by the delivery means, an efficient reception is possible. Since a single parts feeder will do in this case, the entire device can be decreased in size, and the cost can be reduced.

Preferably, the supply means includes a) a feeding disk having on its upper surface a feeding groove extending in the radial direction so as to align the electronic parts, b) a recess disposed at the outer peripheral end of the feeding groove so as to hold one electronic part, the upper surface being inclined with respect to the horizontal plane, and c) a driving means for rotationally driving the feeding disk in one direction. A plurality of electronic parts randomly introduced on the upper surface of the feeding disk are guided from the feeding groove to the recess by rotating the feeding disk, and are separately held in the recess and removed therefrom. Such a feeding disk is disclosed in, for example, Japanese Unexamined Patent Application Publication No. 11-208871. When multiple electronic parts are introduced on the feeding disk at random, they are collected at the bottom due to the inclination of the upper surface of the feeding disk. Some of the electronic parts fall into the feeding groove due to the rotation of the feeding disk, and are oriented in a predetermined direction. Since the feeding groove is continuously formed in the radial direction on the upper surface of the feeding disk, the probability that the electronic parts will fall into the feeding groove is increased. The electronic parts which fall into the feeding groove slide to the outer peripheral end of the feeding groove due to gravity, and enter the cavities. When the feeding groove is turned upward, the electronic parts therein slide downward (toward the center) due to gravity, and only the electronic parts held in the cavities remain. In this way, the electronic parts are separated one by one.

In this case, since the feeding disk serves as both the parts feeder and the separating mechanism, the size and cost of the device are further reduced. Moreover, since there is no need to provide a vibration source such as provided in the parts feeder, quietness is ensured. Thus, there is little adverse effect due to noise during the characteristic measurement.

Preferably, the delivery means is a transfer chute having a plurality of guide paths for separately guiding the electronic parts separately supplied by the supply means to the respective lines of cavities of the transport medium.

When a discharge section of the supply means is circular, since the cavities of the transport medium are arranged in an arc form, when a plurality of electronic parts are simultaneously fed into the cavities, they are prone to fall off therebetween. Accordingly, by respectively guiding the electronic parts separately supplied by the supply means into the cavities in the lines of the transport medium by using the transfer chute having a plurality of guide paths, the electronic parts can be prevented from falling off or from being delayed, and can be reliably fed into the cavities.

The electronic parts can be more reliably fed into the cavities of the transport medium using an air suction device or an air blowing device.

Preferably, an inspection apparatus is constructed by providing a plurality of inspecting sections around the transport medium so as to simultaneously inspect the same number of electronic parts held in the cavities as the number of lines of cavities.

In this case, the same number of electronic parts as the number of the cavity lines can be simultaneously processed, and this easily speeds up the processing. By reducing the receiving space where the electronic parts are fed into the transport medium, the inspection area on the transport medium can be maximized.

In this case, the inspection sections serve to perform, for example, visual inspection or electrical characteristic measurement.

Preferably, the inspecting sections are each formed of a characteristic measuring device having a measuring terminal. The electrical characteristics of the electronic parts held in the lines of cavities are measured by contacting the measuring terminals with the electronic parts when the transport medium is rotated to a predetermined position.

It is preferable that the measuring terminals are contacted simultaneously with the electronic parts held in the cavities in the lines. For example, when the transport medium has four concentric lines of cavities, by taking a characteristic measurement with measuring terminals contacted simultaneously with four electronic parts, the measuring time per electronic part can be increased to four times the conventional measuring time (when one line of cavities are provided). This makes it possible to achieve an inspection apparatus suitable for insulation resistance measurement for capacitors or the like which needs a long measuring time.

Further objects, features, and advantages of the present invention will become apparent from the following description of the preferred embodiments with reference to the attached drawings.

DESCRIPTION OF THE PREFERRED EMBODIMENTS

FIGS. 1 to 8 show an embodiment in which a transport device of the present invention is applied to an inspection apparatus.

Figure 9:
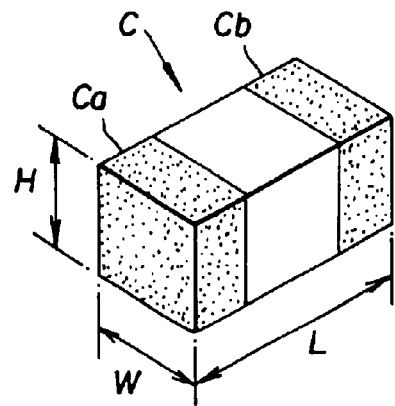
FIG. 9 is a perspective view of an example of an electronic part.

In this embodiment, chip type electronic parts C shaped like a rectangular parallelepiped having a height H, a width W, and a length L (H≅W. L>H, and L>W) are used as electronic parts to be inspected, as shown in FIG. 9. Each electronic part C has electrodes Ca and Cb formed at both ends in the longitudinal direction.

Figure 1:
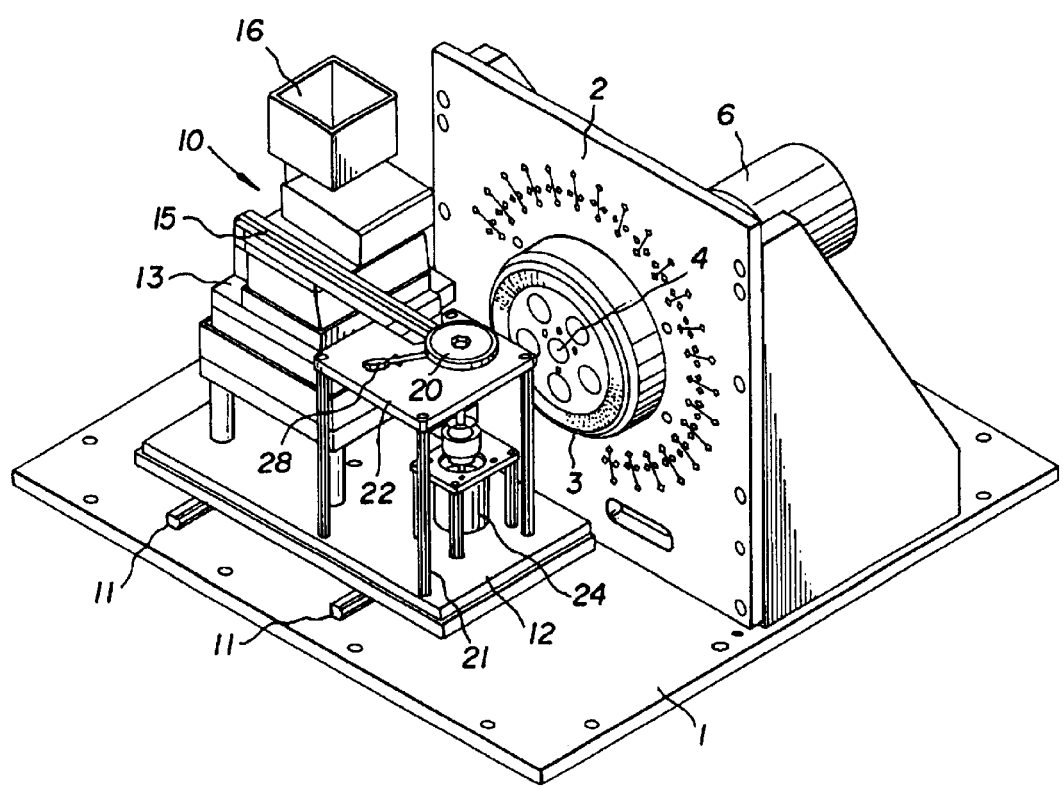
FIG. 1 is a general perspective view of an inspection apparatus using a transport device according to an aspect of the present invention.

The inspection apparatus comprises a turntable 3 serving as a transport medium, a parts feeder 10 serving as a supply means, a distributing rotor 20 serving as a separating means, and the like, as shown in FIG. 1.

An upright mounting wall 2 is placed on a base 1 disposed in a fixed section. The turntable 3 is mounted on the mounting wall 2 so as to rotate about a horizontal rotation axis 4. The turntable 3 is made of an insulating material and is integrally shaped like a disk. A plurality of (four in this embodiment) concentric lines of cavities 5 (see FIG. 5) are formed through the turntable 3. The cavities 5 in the respective lines are arranged in line in the radial direction of the turntable 3. An electronic part C is held in each cavity 5 with the electrodes Ca an Cb at both ends facing forward and backward. The rotation axis 4 of the turntable 3 is linked with a driving motor 6, such as a servomotor. The turntable 3 is intermittently rotated at the pitch equivalent to the pitch of the cavities 5 in the direction of arrow A in FIG. 3.

A movable table 12 is placed on the base 1 so as to move forward and backward along rails 11. A vibratory parts feeder 10, composed of a vibrator 13 and a linear feeder 15, is mounted on the movable table 12. When multiple electronic parts C are introduced from a hopper 16 into the parts feeder 10 at random, they are guided into the linear feeder 15 by vibration produced by the vibrator 13, are aligned, and are successively conveyed along an aligning path 15a of the linear feeder 15.

Figure 6:
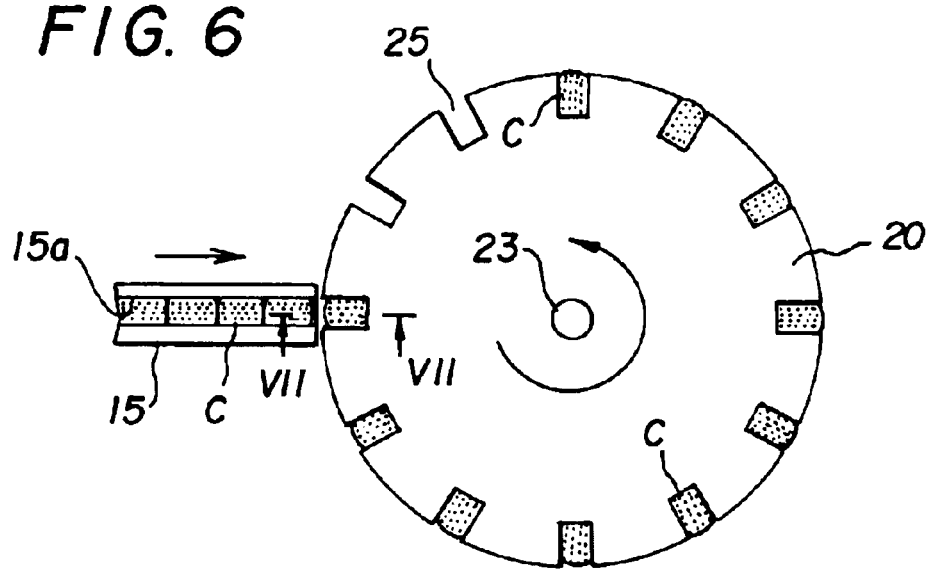
FIG. 6 is an enlarged plan view of a distributing section between a parts feeder and the distributing rotor shown in FIG. 1.
Figure 7:
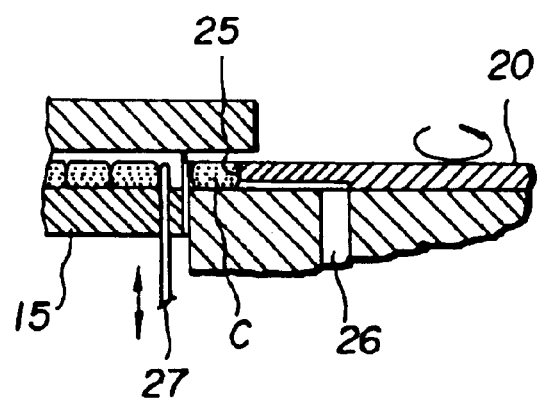
FIG. 7 is a sectional view taken along line VII—VII in FIG. 6.

At the distal end of the linear feeder 15, the distributing rotor 20 is placed, as shown in FIGS. 6 and 7. The distributing rotor 20 is rotatably mounted on a table 22 which is horizontally supported on the movable table 12 via columnar supports 21. A rotation axis 23 of the distributing rotor 20 is linked with a driving motor 24, such as a servomotor. The distributing rotor 20 is intermittently rotated at a fixed pitch and at four times the pitch speed of the turntable 3, in the direction of arrow B (see FIG. 2). Recesses 25 are formed on the outer periphery of the distributing rotor 20 at a pitch equivalent to the pitch of intermittent rotation so as to hold electronic parts C therein. By rotating the distributing rotor 20, the electronic parts C, which are aligned and supplied by the parts feeder 10, can be distributed into the recesses 25 respectively. While twelve recesses 25 are formed on the outer periphery of the distributing rotor 20 in FIG. 6, in reality, a larger number of recesses 25 are formed.

In a transfer section from the parts feeder 10 to the distributing rotor 20, in order for only the leading one of the electronic parts C conveyed by the parts feeder 10 to be reliably separated from subsequent electronic parts C and to be put into the recess 25, air suction may be supplied via an air vent 26 which is formed on the inner side of the recess 25, as shown in FIG. 7. Alternatively, a retractable stopper pin 27, which is disposed at the distal end of the linear feeder 15, may be protruded after the leading electronic part C is fed into the recess 25 so as to stop subsequent electronic parts C. Instead of using the stopper pin 27, the second electronic part may be stopped by air suction. The leading electronic part C and subsequent electronic parts C may be separated by any other means.

Figure 2:
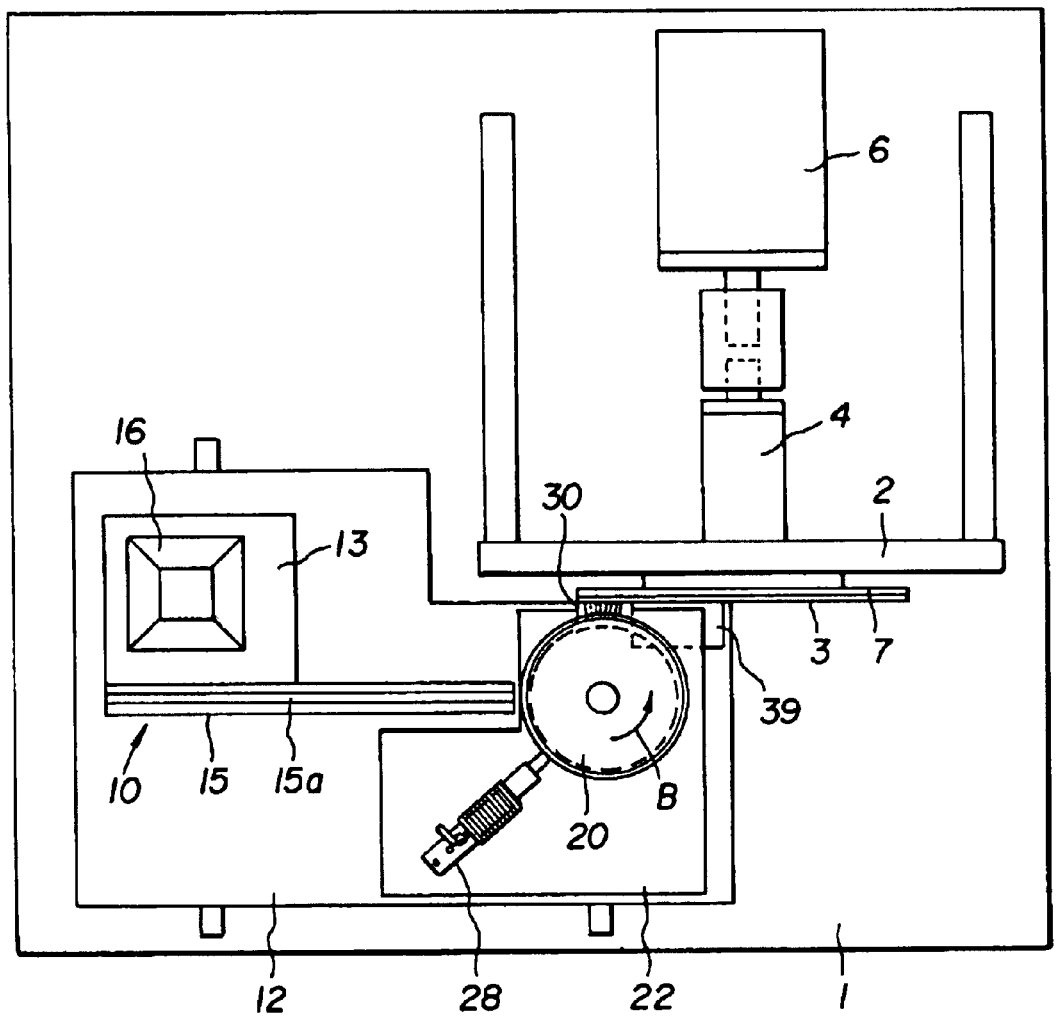
FIG. 2 is a plan view of the inspection apparatus.

The electronic parts C distributed into the recesses 25 of the distributing rotor 20 are horizontally rotated with the rotation of the distributing rotor 20, and electrical characteristics thereof are measured by a measuring device 28 placed on the table 22 (see FIG. 2). For example, when the electronic parts C are ceramic capacitors, a characteristic which can be measured in a relatively short time period (for example, capacitance) is measured by the measuring device 28. When an electronic part is determined to be defective, it is removed by a defective part ejecting section (not shown) before being conveyed to the downstream turntable 3.

Figure 4:
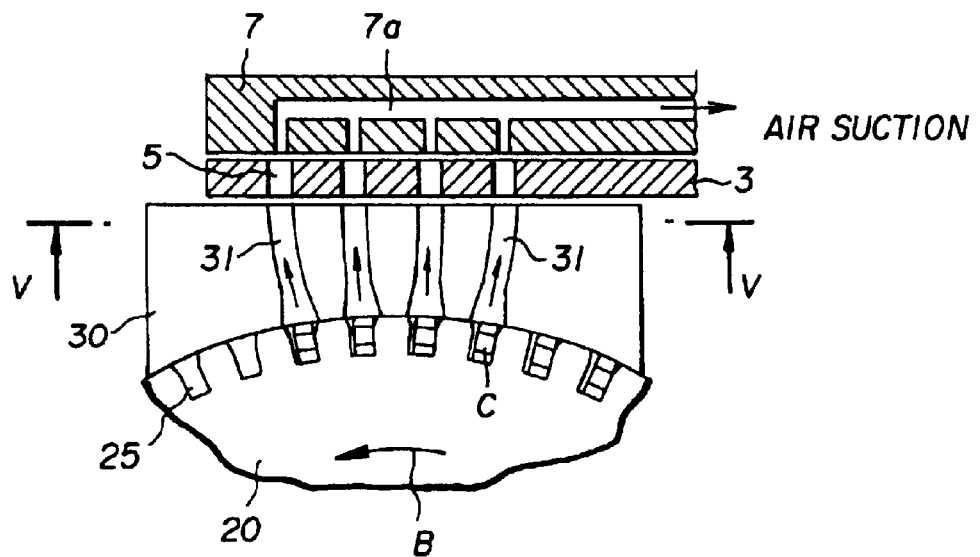
FIG. 4 is an enlarged view of a transfer section between a distributing rotor and a turntable shown in FIG. 1.
Figure 5:
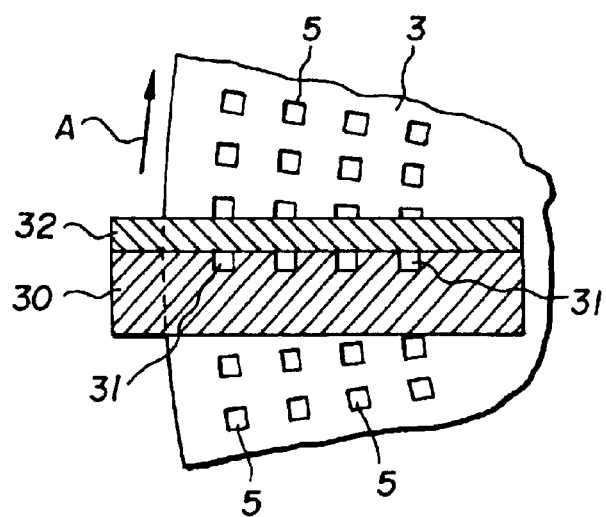
FIG. 5 is a sectional view taken along line V—V in FIG. 4.

The electronic parts C, which are conveyed to a good part ejecting section by the distributing rotor 20, are simultaneously discharged four by four into a transfer chute 30 shown in FIGS. 4 and 5 by blowing compressed air from the air vents 26. That is, after the distributing rotor 20 is rotated by four pitches, four electronic parts C are simultaneously discharged. The transfer chute 30 is fixed on the table 22, and the same number of guide paths 31 as the number of cavity lines of the turn table 3 (four in this embodiment) are formed on the upper surface thereof. The upper surface of the transfer chute 30 is covered with an upper cover 32 (see FIG. 5) for closing the upper surfaces of the guide paths 31. The cavities 5, which are horizontally arranged in the turntable 3, are disposed opposed to the good part ejecting section of the rotor 20 with the transfer chute 30 therebetween. For this reason, four electronic parts C are discharged from the recesses 25 of the rotor 20, are passed through the guide paths 31 of the transfer chute 30, and are simultaneously fed into the cavities 5 which are horizontally arranged in the turntable 3. This can reduce the supply time of the electronic parts C. In this way, the transfer chute 30 serves to correct the direction of movement of the electronic parts C, which are discharged from the recesses 25 of the distributing rotor 20 from the normal direction, to the parallel direction and to thereby smoothly guide the electronic parts C into the cavities 5 of the turntable 3. A guide plate 7 is placed behind the turntable 3 so that the electronic parts C which are fed into the cavities 5 do not fall out the opposite side of the turntable 3. In order to reliably feed the electronic parts C into the cavities 5, an air vent 7a may be formed in the guide plate 7, as necessary, and air suction may be performed from the air vent 7a of the guide plate 7 simultaneously with air blowing from the air vents 26 of the distributing rotor 20. The guide plate 7 is formed over almost the entire periphery behind the turntable 3.

Although not shown, another guide plate is placed in front of the turntable 3 so as to prevent the electronic parts C from falling off frontwardly. The guide plate has terminal insertion holes corresponding to the positions of measuring devices 33, which will be described later.

Figure 3:
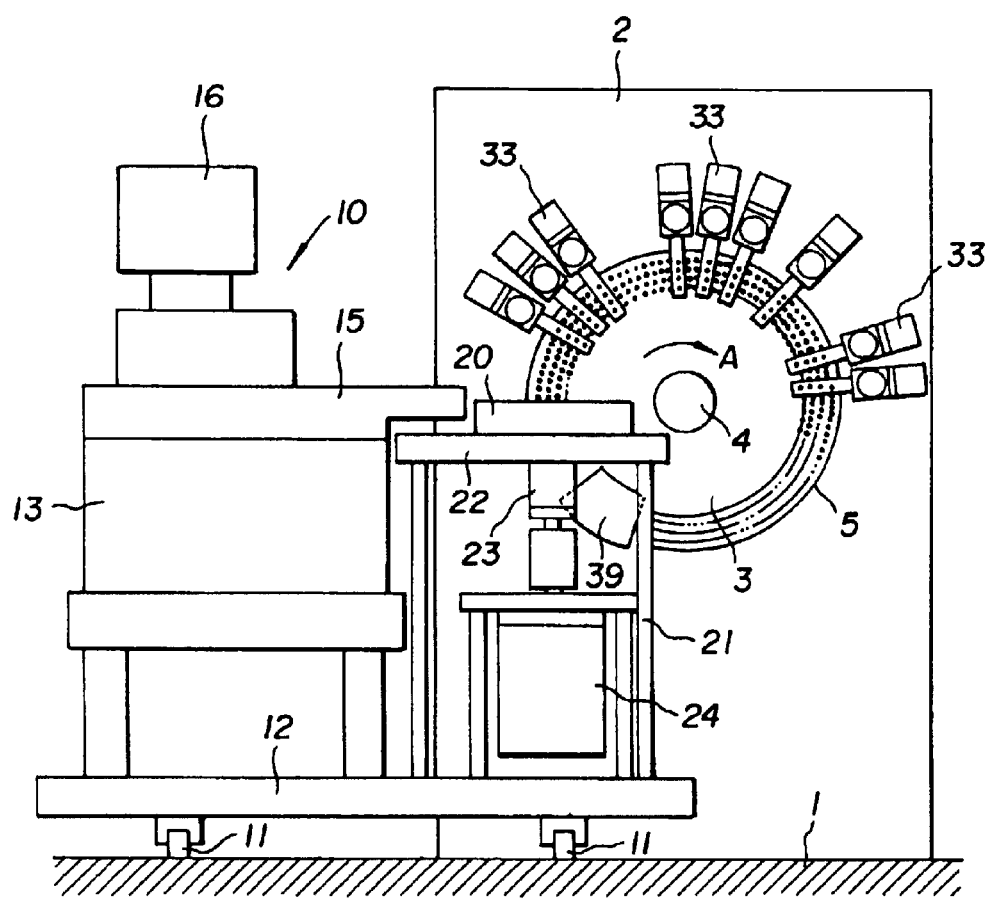
FIG. 3 is a front view of the inspection apparatus.
Figure 8:
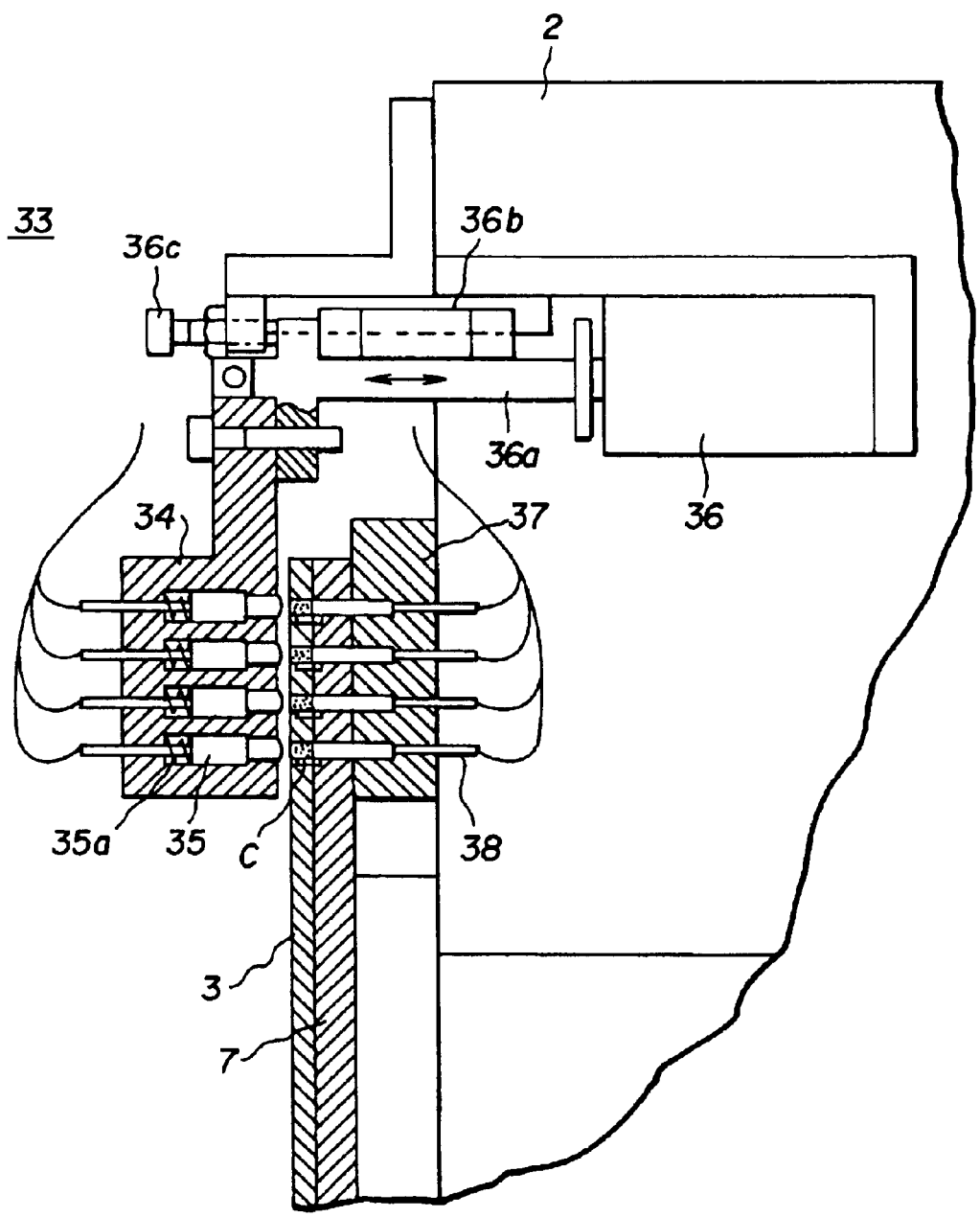
FIG. 8 is an enlarged view of a part of a measuring device.

A plurality of measuring devices 33 are mounted on the surface of the mounting wall 2 so as to surround the turntable 3, as shown in FIG. 3. While the electronic parts C in the cavities 5 of the turntable 3 are passed through the measuring devices 33, electrical characteristics thereof are measured. More specifically, as shown in FIG. 8, a movable terminal block 34 of each measuring device 33 extends along the surface of the turntable 3 in the radial direction. The movable terminal block 34 includes four measuring terminals 35 opposing the electronic parts C held in the turntable 3. A spring 35a is interposed between each measuring terminal 35 and the movable terminal block 34 to maintain contact pressure with the electronic part C. The movable terminal block 34 is linked with a driving shaft 36a of a direct-acting actuator 36 and is driven by the direct-acting actuator 36 to move closer to and apart from the turntable 3, thereby putting each measuring terminal 35 into contact with one end face of the electronic part C. The driving shaft 36a is linearly guided in only one direction by a guide 36b. The distal end position thereof (the open positions of the measuring terminals 35) is regulated by a stopper bolt 36c. A fixed terminal block 37 is placed on the back side of the turntable 3. Four measuring terminals 38, which are fixed in the terminal block 37, are passed through the guide plate 7 for supporting the back of the turntable 3. The four measuring terminals 38 are contacted with the other end faces of the electronic parts C. The measuring terminals 35 and 38 are connected to a measuring apparatus (not shown).

When the turntable 3 is rotated and the electronic parts C are placed between the measuring terminals 35 and 38, the movable terminal block 34 is moved closer to the turntable 3 by the direct-acting actuator 36. The measuring terminals 35 are therefore simultaneously protruded inward into contact with the electrodes Ca an Cb of the four electronic parts C. Thus, the electrical characteristics of the electronic parts C can be measured. For example, when insulation resistances of ceramic capacitors are measured, charging requires a long time. However, since the turntable 3 has four lines of cavities 5, the measuring time per capacitor can be increased to four times that in a turntable having only one line of cavities. Conversely, when the measuring time per capacitor is fixed, throughput can be increased to four times that in the turntable having only one line of cavities.

The structure of the measuring devices 33 is not limited to that shown in FIG. 8. The structure of the measuring devices 33 may be appropriately determined as long as a plurality of electronic parts C, which are held in the cavities 5 arranged in a line in the radial direction can be measured simultaneously.

After the electronic parts C are passed through all the measuring devices 33, they are sorted into good parts and defective parts, or the like and are removed by the removal section 39 when the cavities 5 reach a position which is offset from a position directly below the rotation axis 4 of the turntable 3 and which is toward the transfer chute 30. In this case, the electronic parts C may also be removed by blowing compressed air from the air vent 7a which is formed in the guide plate 7 behind the turntable 3.

As described above, since a plurality of electronic parts C, which are separated beforehand by the distributing rotor 20, are simultaneously put into the cavities 5 of the turntable 3 via the transfer chute 30, there is no need to randomly separate oriented electronic parts in the receiving section of the turntable 3. This minimizes the space of the receiving section of the turntable 3. Moreover, since the area between the transfer chute 30 and the removal section 39 can be used as part of the working area, the working area can be made as large as possible.

Figure 10:
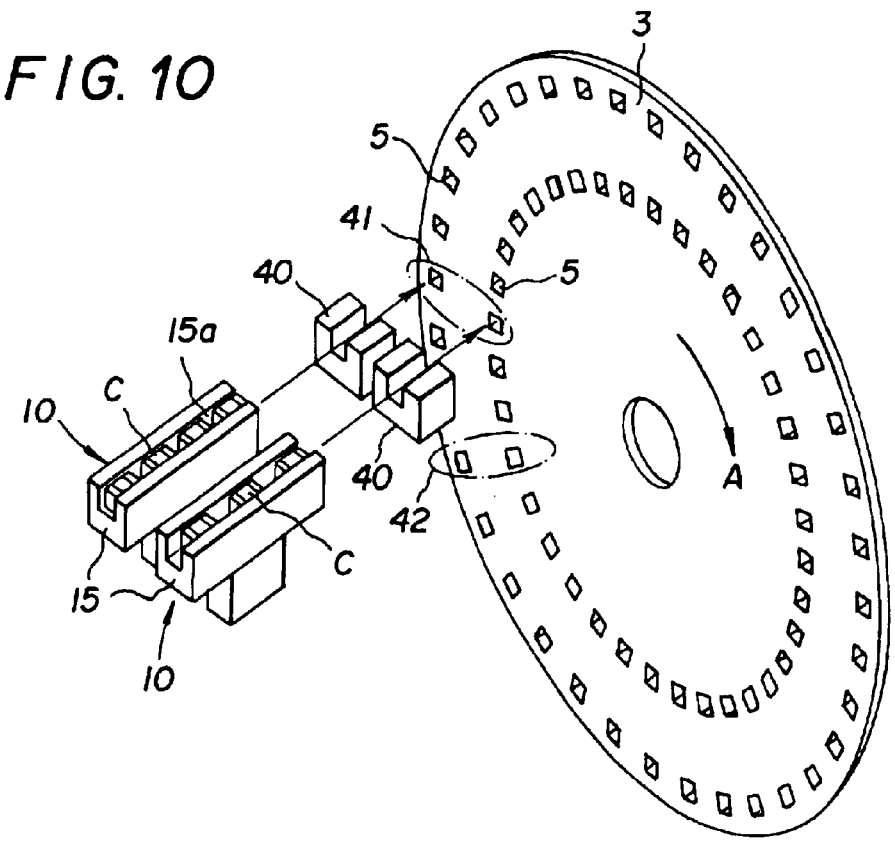
FIG. 10 is a schematic perspective view of a transport device according to a second embodiment of the present invention.

FIG. 10 shows a transport device according to a second embodiment of the present invention. The same components as those in the first embodiment are denoted by the same reference numerals, and repetitive descriptions thereof are omitted.

This embodiment adopts a turntable 3 serving as a transport medium which rotates about a horizontal axis and has two concentric lines of cavities 5. The same number of parts feeders 10 and separating mechanisms 40 are provided as the number of lines of the cavities 5. When electronic parts C are introduced in each parts feeder 10 at random, they are aligned in line and are successively conveyed along a path 15a of a linear feeder 15. The electronic parts C conveyed to the distal end of the linear feeder 15 are separated into the leading electronic part and subsequent electronic parts by a separating mechanism 40. The separating mechanism 40 may adopt, for example, a separating method similar to that in FIG. 7. The leading electronic part C, which is separated from the subsequent components separated by the separating mechanism 40, is put into a cavity 5 at a receiving section 41 of the turntable 3 by, for example, using air suction from the cavity 5 side. Subsequently, the turntable 3 is intermittently rotated pitch by pitch by a driving means, such as a servomotor, so as to convey the electronic part C in the direction of arrow A.

A plurality of measuring devices (not shown) are placed around the turntable 3 and simultaneously measure electronic parts C in the cavities 5 which are arranged in a line in the radial direction. After measurement is completed, the electronic parts C are transported by the turntable 3 and are removed at a removal section 42, which is disposed just before the receiving section 41 by, for example, blowing air.

While a plurality of parts feeders 10 are used in the above description, a plurality of linear feeders 15 may be linked with a single parts feeder.

Since the electronic parts C can be directly supplied from the parts feeder 10 to the turntable 3 in this embodiment, the installation space can be reduced. Moreover, since the receiving section 41 and the removal section 42 are disposed adjacent to each other, the working area, except for these sections, can be enlarged.

Figure 11:
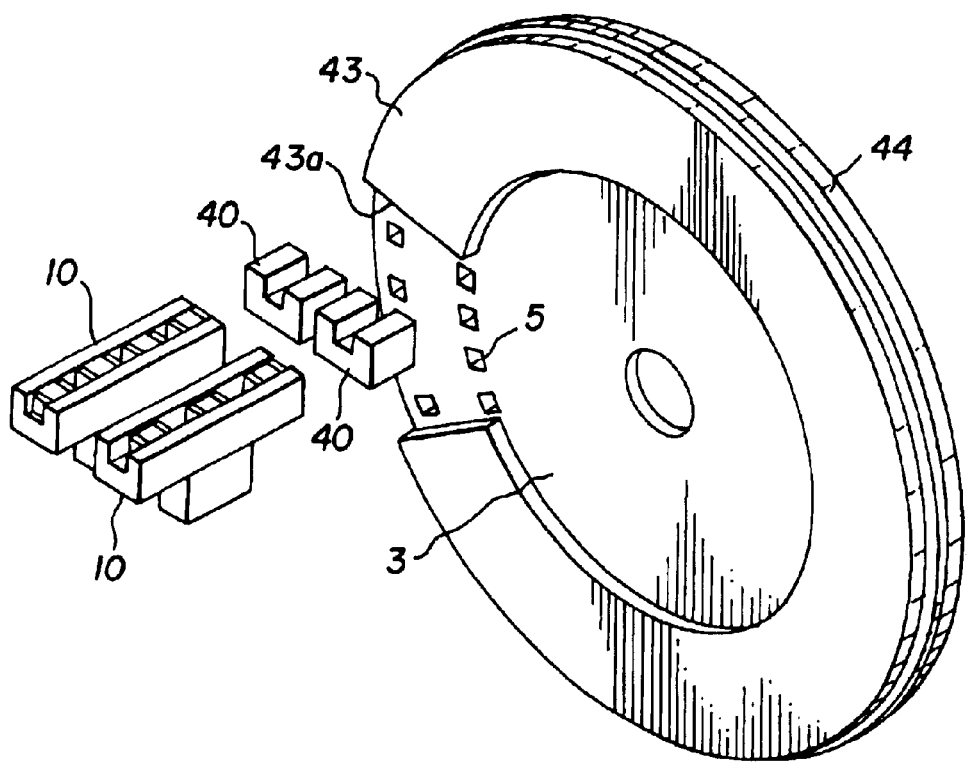
FIG. 11 is a schematic perspective view of a transport device according to a third embodiment of the present invention.

FIG. 11 shows a third embodiment as a modification of the second embodiment shown in FIG. 10.

In this embodiment, guide plates 43 and 44, made of a transparent acrylic board or the like, are placed on both sides of a turntable 3. This can stabilize the attitudes of electronic parts C which are conveyed while being held inside cavities 5 of the turntable 3.

The front-side guide plate 43 has a cutout portion 43a corresponding to a receiving section and a removal section.

While the front- and back-side guide plates 43 and 44 are shown having no holes, in reality, they have holes or openings through which measuring terminals or the like are passed.

FIGS. 12 to 17 show a transport device according to a fourth embodiment of the present invention. The same components as those in the first embodiment are denoted by the same reference numerals, and repetitive descriptions thereof are omitted.

In this embodiment, a turntable 3 having four concentric lines of cavities 5, in a manner similar to that in the first embodiment, is used as a transport medium. A feeding disk 50 disclosed in Japanese Unexamined Patent Application Publication No. 11-208871 is used as a supply means.

In the transport device of this embodiment, electronic parts C are separated by the feeding disk 50 which is placed in an inclined state. The same number of electronic parts as the number of lines of cavities 5 of the turntable 3, which is rotating about the horizontal axis, are simultaneously supplied into the cavities 5 at a receiving section 42 (see FIG. 12).

Figure 12:
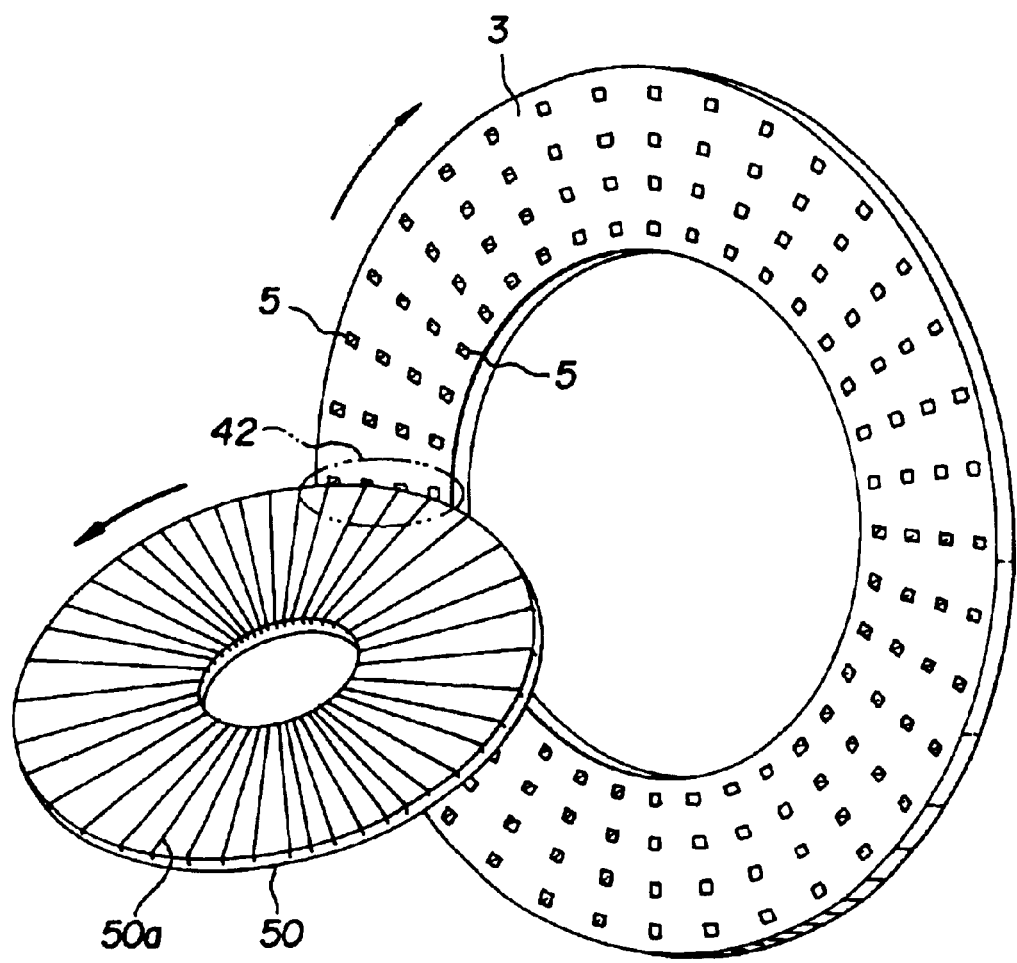
FIG. 12 is a schematic perspective view of a transport device according to a fourth embodiment of the present invention.
Figure 13:
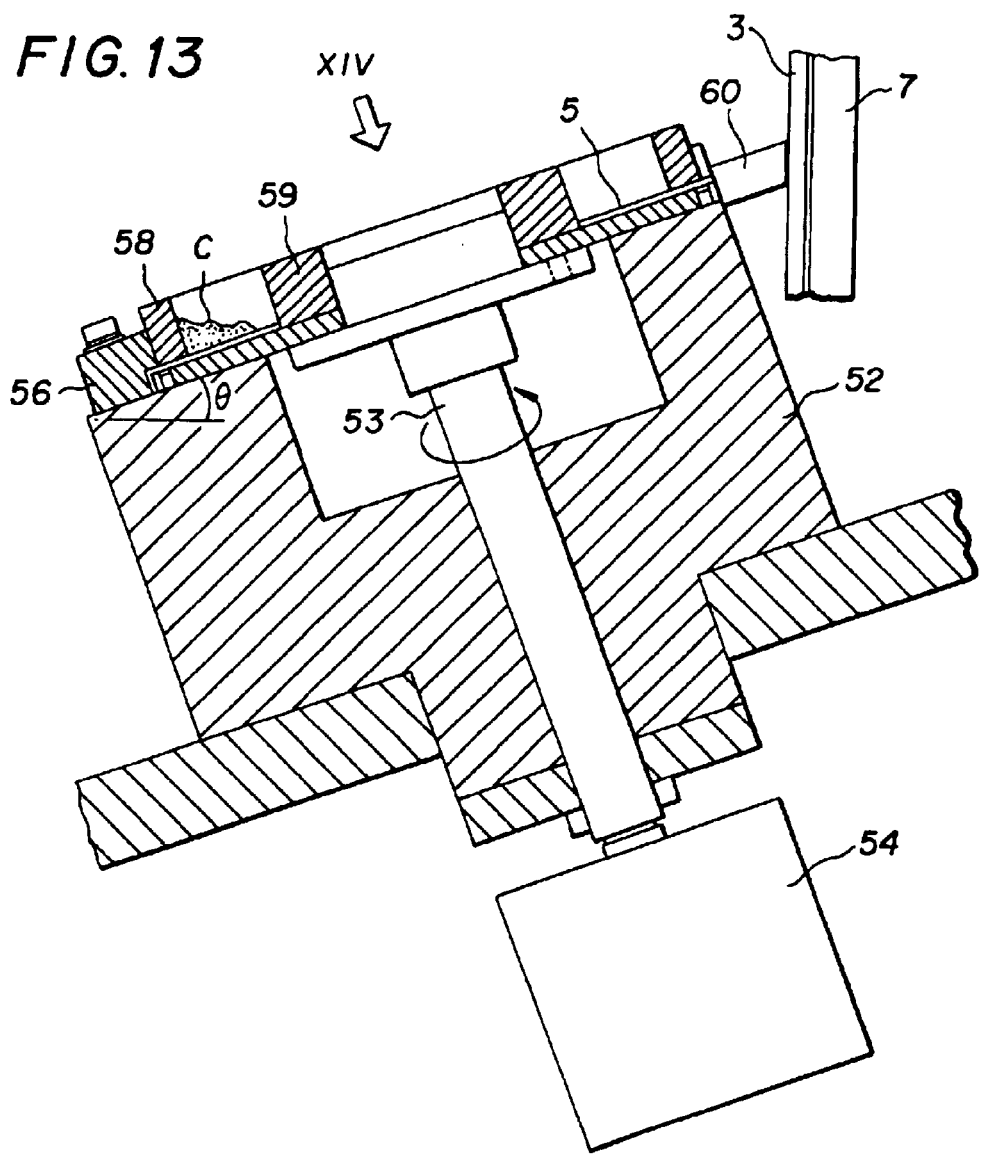
FIG. 13 is a detailed longitudinal sectional view of the transport device shown in FIG. 12.

The feeding disk 50 is placed on an inclined base 52 so as to slide at a predetermined inclination θ to the horizontal plane, as shown in FIGS. 12 and 13. A driving shaft 53 is rotatably passed through the center of the base 52. The center of the feeding disk 50 is linked with the leading end of the driving shaft 53. The driving shaft 53 is linked with a motor 54 so as to intermittently rotate the feeding disk 50 counterclockwise at a pitch equivalent to the open angle of feeding grooves 50a which will be described later. An outer guide 56 is fixed on the outer surface of the base 52 to surround a part of the outer peripheral portion of the feeding disk 50.

On the upper surface of the feeding disk 50, multiple feeding grooves 50a radially extend from the inner portion to the outer peripheral edge. The width and depth of each feeding groove 50a is set to be larger than the length of the short sides H and W of the electronic part C and to be smaller than the length of the long side L. For this reason, when multiple electronic parts C are introduced to the feeding disk 50 and the feeding disk 50 is rotated, they fall into the feeding grooves 50a by the action of gravity, and are thereby aligned in the longitudinal direction.

Figure 15:
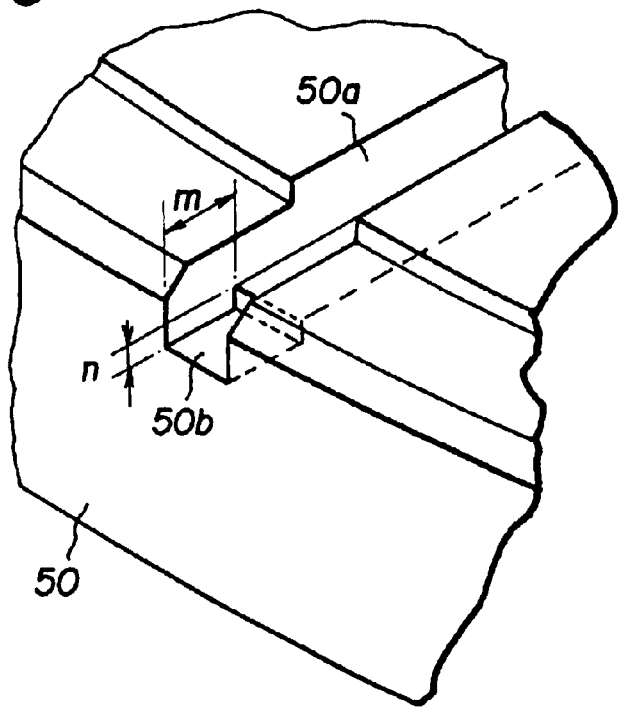
FIG. 15 is a perspective view of the outer peripheral portion of a feeding disk shown in FIG. 12.

As shown in FIG. 15, a recess 50b for holding only one electronic part C is formed at the outer peripheral end of each feeding groove 50a. The recess 50b is located at a position which is lower than the feeding groove 50a. Since the length m in the radial direction of the recess 50b is shorter than the length of the long side L of the electronic part C in this embodiment, a part of the electronic part C held in the recess 50b protrudes toward the side of the outer peripheral surface of the feeding disk 50. A height difference n between the bottom surfaces of the recess 50b and the feeding groove 50a is smaller than the length W of the short side of the electronic part C. For this reason, even when a subsequent electronic part C is placed in the feeding groove 50a, which is inclined downward, and attempts to move toward the recess 50b, the movement thereof toward the outer periphery is limited by the electronic part C in the recess 50b. An air vent 50c is formed on the inner peripheral side of the recess 50b. The electronic part C, held in the recess 50b, is drawn and held on the inner side of the recess 50b by suction from the air vent 50c.

Figure 16:
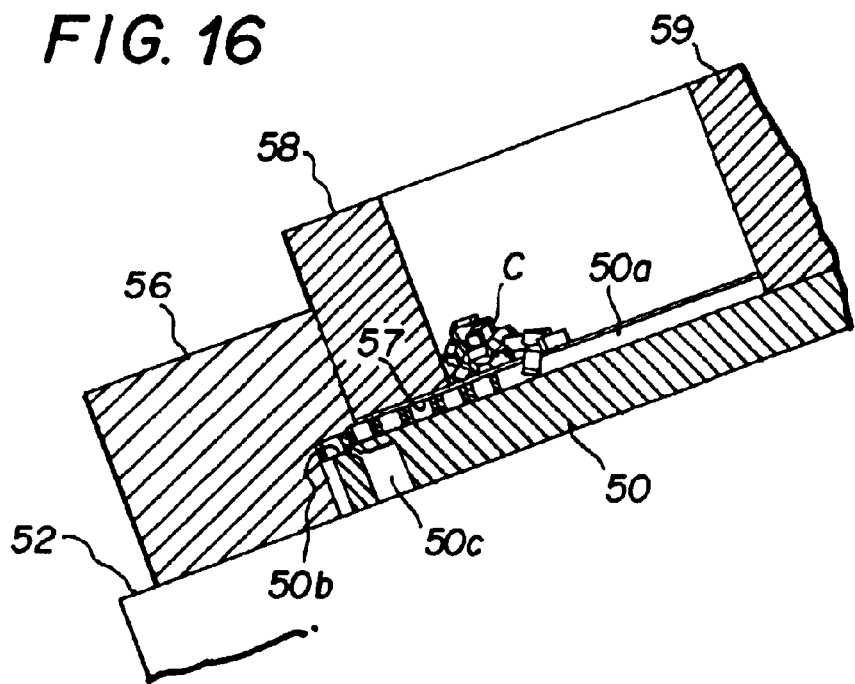
FIG. 16 is a sectional view taken along line XVI—XVI in FIG. 14.
Figure 17:
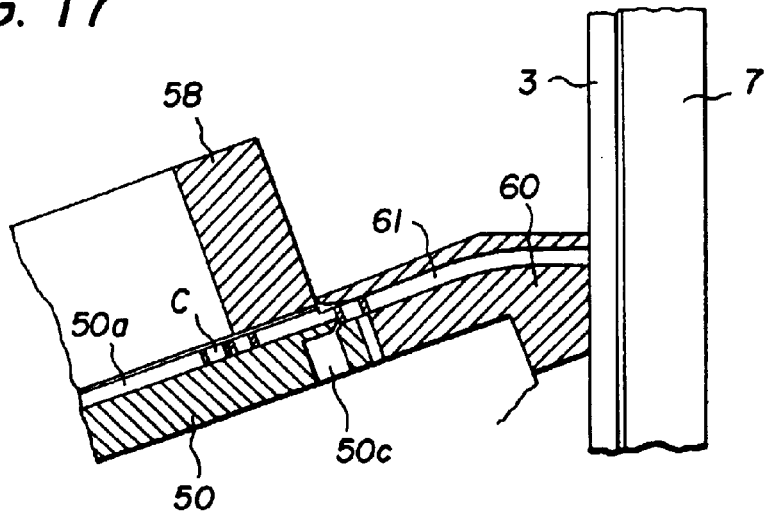
FIG. 17 is a sectional view taken along line XVII—XVII in FIG. 14.

A guide ring 58 is fixed on the outer peripheral upper surface of the feeding disk 50 so as to form a gate 57 for passing only electronic parts C aligned in the feeding groove 50a toward the outer periphery of the feeding disk 50 (see FIG. 16). An inner ring 59 is fixed on the upper surface of the feeding disk 50 and at the inner ends of the feeding grooves 50a. Thus, an annular accommodating space for accommodating multiple electronic parts is formed between the inner ring 59 and the guide ring 58 on the upper surface of the feeding disk 50.

Figure 14:
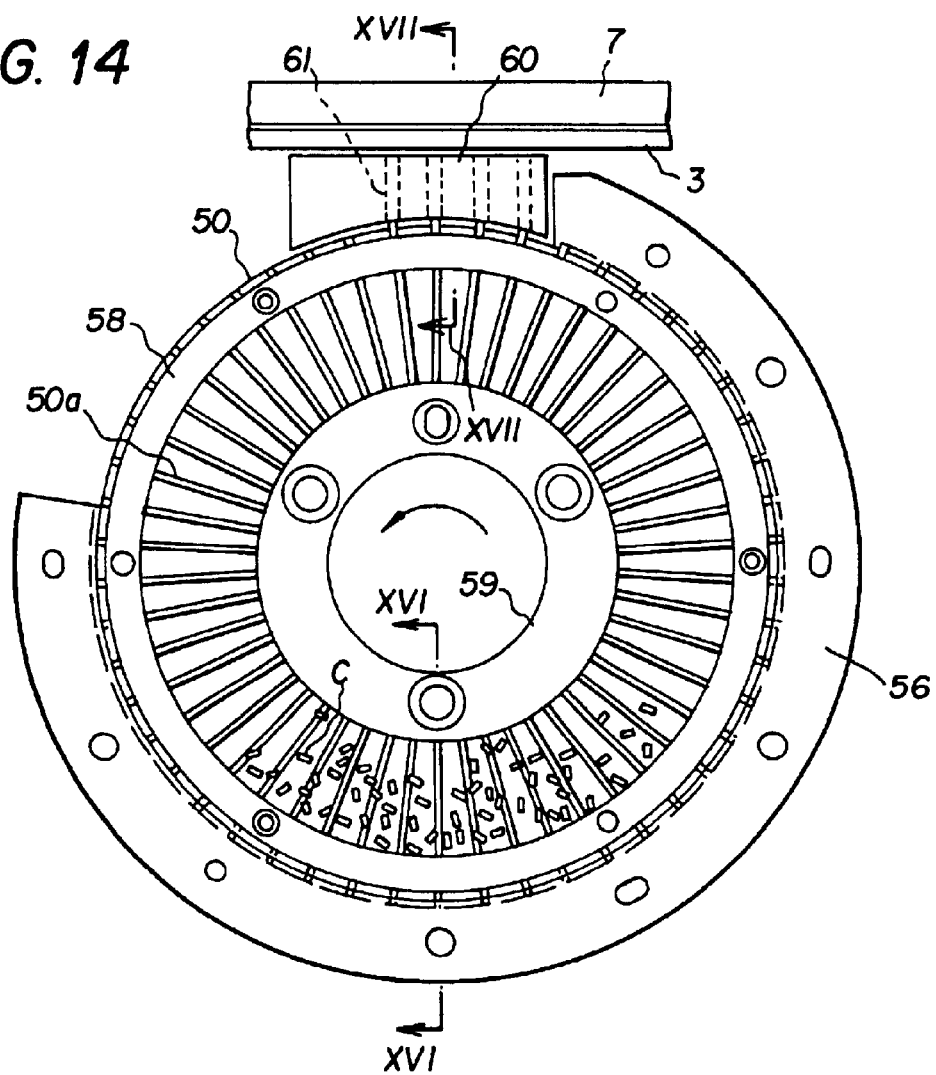
FIG. 14 is a view, as viewed from the direction of arrow XIV in FIG. 13.

The outer guide 56 is placed with an appropriate space so as to surround the outer periphery of the feeding disk 50. In particular, an area including the lower half thereof so that electronic parts C, which slide in the feeding grooves 50a and are put in the recesses 50b, do not fall off the feeding disk 50. In this embodiment, the outer guide 56 surrounds an approximately 240-degree sector of the feeding disk 50, as shown in FIG. 14. A transfer chute 60 is fixed on the base 52 adjacent to the top of the feeding disk 50 where the outer guide 56 is cut out, that is, at the receiving section 42. A plurality of (for example, four) electronic parts C, which are separately held in the recesses 50b of the feeding disk 40 are simultaneously fed into the cavities 5 of the turntable 3 via the transfer chute 60. The transfer chute 60 has a structure substantially similar to that of the transfer chute 30 in the first embodiment. The transfer chute 60 has guide paths 61 for correcting the direction of movement of the electronic parts C which are discharged from the recesses 50b of the feeding disk 50. The guide paths 61 are inclined upward to the horizontal direction and guide the electronic parts C into the cavities 5 of the turntable 3. In this case, it is preferable to blow compressed air from the air vents 50c, which are formed on the inner sides of the recesses 50b, in order to discharge the electronic parts C from the recesses 50b.

A description will now be given of the operation of the transport device having the above configuration.

First, multiple electronic parts C are randomly introduced onto the upper surface of the rotating feeding disk 50, in particular, into the space enclosed by the inner ring 59 and the guide ring 58 (see FIG. 16). Since the upper surface of the feeding disk 50 is inclined, the electronic parts C are collected at the bottom of the feeding disk 50, and some of the components C fall in the feeding grooves 50a and are aligned. The electronic parts C that fall into the feeding groove 50a slide downward because of gravity and pass through the gates 57. Only the leading one of the electronic parts C is put into the recess 50b. The electronic parts C, which do not initially fall into the feeding grooves 50a, gradually fall therein by the stirring and attitude change caused by the rotation of the feeding disk 50.

When the feeding groove 50a, in which the electronic parts C fall, is turned upward, the electronic parts C other than the electronic part C in the recess 50b slide downward along the feeding groove 50a because of gravity, and only the electronic part C in the recess 50b is separated from the remaining parts C. Since the electronic part C in the recess 50b is held on the inner peripheral surface of the recess 50b by suction through the air vent 50a, the part C is prevented from inadvertently falling into the feeding groove 50a. Also, friction due to the part C sliding on the outer guide 56 is reduced. With the rotation of the feeding disk 50, the electronic parts C, which are separately held in the respective recesses 50b, are conveyed to the upper part of the feeding disk 50 and are fed into the cavities 5 of the turntable 3 via the transfer chute 60 which is connected to the outer guide 56. Therefore, by blowing compressed air from the air vents 50c, the electronic parts C can be reliably fed to the chute 60.

When the electronic parts C are transferred from the feeding disk 50 to the turntable 3 via the transfer chute 60, since the turntable 3 has four concentric lines of cavities 5, four electronic parts C are simultaneously transferred to the turntable 3 after the feeding disk 50 rotates by four pitches. This can reduce the necessary transferring time. Since the operations that are to be performed on the electronic parts C on the turntable 3 (visual inspection and inspection of electrical characteristics) and the removing process are similar to those in the first embodiment, descriptions thereof are omitted.

The present invention is not limited to the configurations in the above embodiments.

Figure 18:
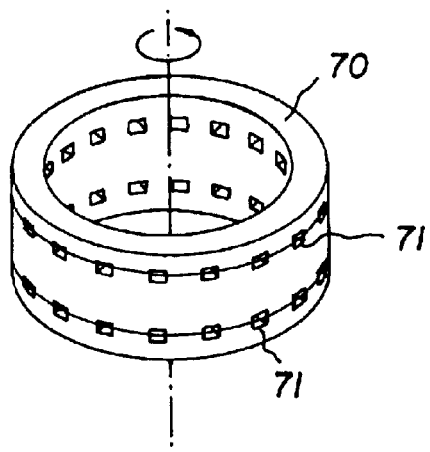
FIG. 18 is a perspective view of another example of a transport medium according to the present invention.
Figure 19:
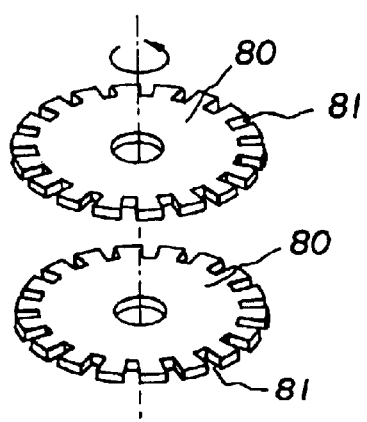
FIG. 19 is a perspective view of a further example of a transport medium according to the present invention.

The transport medium is not limited to a disklike turntable having a plurality of concentric lines of cavities. For example, a cylindrical transport medium 70 may be provided with a plurality of lines of cavities 71 formed therethrough and arranged in the axial direction on the same circumference, as shown in FIG. 18. A plurality of disklike transport medium 80 having cavities 81 formed at a fixed pitch on the outer periphery may be placed one on another, as shown in FIG. 19. While the chip component shaped like a rectangular parallelepiped shown in FIG. 9 is given as an example of an electronic part C, the electronic part may have any shape, for example, a cubic shape, a cylindrical shape, or a disklike shape.

Furthermore, the same number of known bulk feeders used in chip mounters and the like, which have parts aligning and separating functions (disclosed in, for example, Japanese Unexamined Patent Applications Publication Nos. 63-127600 and 8-222890), as the number of lines of cavities of the transport medium may be used for the supply means. In this case, the supply means can be easily constructed from existing devices.

As is evident from the above description, according to the present invention, since the transport medium which is used for performing various operations has a plurality of concentric lines of cavities, throughput can be multiplied by the number of cavity lines. Since electronic parts are separated one by one by the supply means before being inserted into the cavities of the transport medium, it is only necessary for the delivery means to simply insert the electronic parts into the cavities. For this reason, delivery errors are avoided, the receiving section does not occupy a large space, and the working area can be provided on the transport medium.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An electronic part transport device comprising:
   a transport medium having a plurality of cavities arranged in lines, said lines being concentric with respect to a rotation axis;
   driving means for rotationally driving said transport medium;
   supply means for separating and supplying a plurality of randomly introduced electronic parts one by one;
   delivery means for feeding the electronic parts, which are separately supplied by said supply means, into said lines of said cavities of said transport medium; and
   removal means for removing the electronic parts from said cavities of said transport medium.

2. The electronic part transport device according to claim 1, wherein said supply means comprises:
   a parts feeder having a same number of aligning paths as number of said lines of said cavities in said transport medium to successively supply the electronic parts which are introduced at random while aligning the electronic parts in said aligning paths; and
   separating means disposed at a distal end of each of said aligning paths to separate one by one the electronic parts which are successively conveyed by said parts feeder.

3. The electronic part transport device according to claim 1, wherein said supply means comprises:
   a parts feeder for successively supplying the randomly introduced electronic parts while aligning the electronic parts;
   a distributing rotor for separately distributing the electronic parts, which are aligned and supplied by said parts feeder, into a plurality of recesses formed on an outer periphery thereof; and
   driving means for rotationally driving said distributing rotor in one direction.

4. The electronic part transport device according to claim 1, wherein said supply means comprises:
   a feeding disk having on an upper surface a feeding groove extending in a radial direction to align the electronic parts, and a recess disposed at an outer peripheral end of said feeding groove to hold one electronic part, said upper surface being inclined with respect to a horizontal plane; and
   driving means for rotationally driving said feeding disk in one direction, and
   wherein a plurality of electronic parts, which are randomly introduced on the upper surface of said feeding disk, are guided from said feeding groove to said recess by rotation of said feeding disk, and are separately held in and removed from said recess.

5. The electronic part transport device according to claim 1, wherein said delivery means includes a transfer chute having a plurality of guide paths for separately guiding the electronic parts, which are separately supplied by said supply means, to said respective lines of said cavities of said transport medium.

6. The electronic part transport device according to claim 1, further comprising an electronic part inspection apparatus wherein a plurality of inspecting sections are placed around said transport medium to simultaneously inspect the same number of electronic parts held in said cavities as the number of said lines of said cavities.

7. The electronic part transport device according to claim 2, further comprising an electronic part inspection apparatus wherein a plurality of inspecting sections are placed around said transport medium to simultaneously inspect the same number of electronic parts held in said cavities as the number of said lines of said cavities.

8. The electronic part transport device according to claim 3, further comprising an electronic part inspection apparatus wherein a plurality of inspecting sections are placed around said transport medium to simultaneously inspect the same number of electronic parts held in said cavities as the number of said lines of said cavities.

9. The electronic part transport device according to claim 4, further comprising an electronic part inspection apparatus wherein a plurality of inspecting sections are placed around said transport medium to simultaneously inspect the same number of electronic parts held in said cavities as the number of said lines of said cavities.

10. The electronic part transport device according to claim 5, further comprising an electronic part inspection apparatus wherein a plurality of inspecting sections are placed around said transport medium to simultaneously inspect the same number of electronic parts held in said cavities as the number of said lines of said cavities.

11. The electronic part transport device according to claim 6, wherein said inspecting sections are each formed of a characteristic measuring device having a measuring terminal, said characteristic measuring device measures electrical characteristics of the electronic parts held in said lines of said cavities by contacting said measuring terminals with the electronic parts when said transport medium is rotated to a predetermined position.

12. The electronic part transport device according to claim 7, wherein said inspecting sections are each formed of a characteristic measuring device having a measuring terminal, said characteristic measuring device measures electrical characteristics of the electronic parts held in said lines of said cavities by contacting said measuring terminals with the electronic parts when said transport medium is rotated to a predetermined position.

13. The electronic part transport device according to claim 8, wherein said inspecting sections are each formed of a characteristic measuring device having a measuring terminal, said characteristic measuring device measures electrical characteristics of the electronic parts held in said lines of said cavities by contacting said measuring terminals with the electronic parts when said transport medium is rotated to a predetermined position.

14. The electronic part transport device according to claim 9, wherein said inspecting sections are each formed of a characteristic measuring device having a measuring terminal, said characteristic measuring device measures electrical characteristics of the electronic parts held in said lines of said cavities by contacting said measuring terminals with the electronic parts when said transport medium is rotated to a predetermined position.

15. The electronic part transport device according to claim 10, wherein said inspecting sections are each formed of a characteristic measuring device having a measuring terminal, said characteristic measuring device measures electrical characteristics of the electronic parts held in said lines of said cavities by contacting said measuring terminals with the electronic parts when said transport medium is rotated to a predetermined position.

16. The electronic part transport device according to claim 1, wherein said delivery means simultaneously feeding the electronic parts into one line of said cavities.

17. The electronic part transport device according to claim 1, wherein said removal means simultaneously removing the electronic parts from one line of cavities.

18. The electronic part transport device according to claim 1, wherein said removal means is located immediately adjacent said delivery means.

19. An electronic part transport device comprising:
a transport medium having a plurality of cavities arranged in lines in a radial direction with respect to a rotation axis;
a driving means for rotationally driving said transport medium;
supply means for separating and supplying one by one a plurality of randomly arranged electronic parts;
delivering means for simultaneously feeding the electronic parts from the supply means into one of said lines of cavities; and
removal means for simultaneously discharging the electronic parts from one of said lines of cavities.

20. An electronic part transport device comprising:
a transport medium having a plurality of cavities arranged in lines in a radial direction with respect to a rotation axis;
a driving means for rotationally driving said transport medium;
supply means for separating and supplying one by one a plurality of randomly arranged electronic parts;
delivering means for simultaneously feeding the electronic parts from the supply means into one of said lines of cavities;
removal means for simultaneously discharging the electronic parts from one of said lines of cavities; and
a plurality of inspection means, placed around said transport medium, each inspection means for simultaneously inspecting the electronic parts held in one of said lines of cavities.

* * * * *